United States Patent [19]

Hakim

[11] Patent Number: 4,803,127
[45] Date of Patent: Feb. 7, 1989

[54] VAPOR DEPOSITION OF METAL COMPOUND COATING UTILIZING METAL SUB-HALIDES AND COATED METAL ARTICLE

[75] Inventor: M. Javid Hakim, Burlington, Canada

[73] Assignee: Liburdi Engineering Limited, Ontario, Canada

[21] Appl. No.: 111,144

[22] Filed: Oct. 22, 1987

Related U.S. Application Data

[63] Continuation of Ser. No. 943,871, Dec. 19, 1986, abandoned, which is a continuation of Ser. No. 788,701, Oct. 21, 1985, abandoned, which is a continuation of Ser. No. 577,225, Feb. 6, 1984, abandoned, which is a continuation-in-part of Ser. No. 469,857, Feb. 25, 1983, abandoned.

[51] Int. Cl.$^4$ .................. B32B 15/04; B32B 19/00
[52] U.S. Cl. .................... 428/457; 427/249; 427/255; 427/255.2; 428/697; 428/698
[58] Field of Search ............ 427/255.2, 255, 255.4, 427/253, 249; 428/457, 689, 697, 698

[56] References Cited

U.S. PATENT DOCUMENTS

| | | | |
|---|---|---|---|
| 2,962,399 | 11/1960 | Ruppert et al. | 427/249 |
| 3,637,422 | 1/1972 | Landinham et al. | 427/255.2 |
| 3,654,895 | 4/1972 | Bloom et al. | 118/620 |
| 3,656,995 | 4/1972 | Reedy | 427/255.2 |
| 3,721,577 | 3/1973 | Woerner | 427/249 |
| 3,784,402 | 1/1974 | Reedy | 427/255.2 |
| 3,888,705 | 6/1975 | Fletcher et al. | 427/255.4 |
| 3,959,557 | 5/1976 | Berry | 427/255.2 |
| 4,196,233 | 4/1980 | Bitzer et al. | 427/249 |
| 4,299,861 | 11/1981 | Dietrich et al. | 427/255.2 |

FOREIGN PATENT DOCUMENTS

| | | | |
|---|---|---|---|
| 2113853 | 5/1973 | Fed. Rep. of Germany | 427/255.2 |
| 731990 | 6/1955 | United Kingdom | 427/255.2 |
| 773702 | 5/1957 | United Kingdom | 427/255.2 |
| 1519699 | 8/1978 | United Kingdom | 427/249 |

OTHER PUBLICATIONS

Chemical Abstracts, vol. 98, No. 6, 1983, "Reaction Process of Vanadium Tetrachloride with Ammonia in the Vapor Phase and Properties of the Vanadium Nitride Formed", p. 698.
Patent Abstracts of Japan, vol. 7, No. 276(E-215) [1421], Dec. 9, 1983, p. 698, No. 45729j.
Chemical Abstracts, vol. 94, No. 13, Jun. 1981, p. 247, No. 212559e.
Cho et al., "Study of Growth Rate & Failure Mode of Chemically Vapour Deposited TiN, TiC$_x$N$_y$ & TiC Cemented Tungsten Carbide", Journal of Materials Science 17(1982), pp. 2495-2502.
Takahashi et al, "TiC$_x$N$_y$ & TiC$_x$-TiN Films Obtained by CVD in an Ultrasonic Field", J. of Materials Science 14(1979), pp. 1285-1290.
Podob, "CVD Hard Coatings Lengthen Tool Life", Metal Progress, pp. 50-52, May, 1982.

Primary Examiner—Sadie Childs
Attorney, Agent, or Firm—Stevens, Davis, Miller & Mosher

[57] ABSTRACT

A process for the chemical vapor deposition on substrates of coatings comprising compounds of a titanium sub-group of metals, the vanadium sub-group of metals and the chromium sub-group of metals at temperatures in the range of 250° C. is disclosed. Sub-halides, such as TiCl$_3$, are reacted with N$_2$ and H$_2$ and thermodynamic and kinetic parameters are manipulated by flow rates and partial pressures of the reactants to achieve the deposition reaction in the temperature range of 250° C. to 850° C. The invention also relates to a metal compound coated article. An apparatus for performing the process is also disclosed.

37 Claims, 2 Drawing Sheets

VAPOR DEPOSITION OF METAL COMPOUND COATING UTILIZING METAL SUB-HALIDES AND COATED METAL ARTICLE

This application is a continuation of application Ser. No. 943,781, filed Dec. 19, 1986 now abandoned, which is a continuation of Ser. No. 788,701, filed 10/21/85, now abandoned, which in turn is a continuation of Ser. No. 577,225 filed Feb. 6, 1984, now abandoned, which is a continuation-in-part of application Ser. No. 469,857, filed Feb. 25, 1983 now abandoned.

FIELD OF THE INVENTION

This invention relates to chemical vapor deposition of compounds of the titanium sub-group of elements and applies in addition to the vanadium sub-group and chromium sub-group of elements as coatings on a chosen substrate at low temperatures. It also relates to a metal compound coated article.

Such coatings can have various uses when applied to a substrate. For example, coatings of the titanium sub-groups are desirable on metalworking tools to increase the useful life of the tool. Others, such as niobium nitride coatings are useful as a super conductive material.

BACKGROUND ART

Depending upon the use to which the coating is to be put or the substrate on which the coating is put, the temperature at which a coating can be deposited may be important. Critical temperatures are often involved above which the properties of the substrate are altered.

For coating drills and machine tools with compounds of the titanium sub-group of elements to lengthen the useful life of the tool, nitrides, carbides and carbonitrides of titanium metal are desirable coatings. Compounds such as titanium nitride can be deposited as coatings by chemical vapor deposition (CVD) at temperatures of about 1000° C. or higher.

However, most tool steels are hardened and tempered; and if temperatures exceeding the tempering temperatures are used, the tools lose their temper and must be re-heat treated. When re-heat treated, distortion becomes a problem and tool tolerances are affected. Thus, it is preferable to carry out any coating deposition at temperatures below the softening point of the tool metal in order to avoid affecting the temper of the tool steel.

The coating of metalworking tools with titanium nitride, is a typical example of a coating situation in which low temperature deposition of the coating is desirable. Present processes deposit titanium nitride by chemical vapor deposition by passing titanium tetrachloride, nitrogen and hydrogen over the substrate at temperatures of about 1000° C. or higher. Other existing processes, also operating in the range of 1000° C. add a hydrocarbon gas, such as methane, to include titanium carbide in the coating deposit. These temperatures have detrimental effects on tool steel temper. Re-heat treating to re-establish temper detrimentally affects tolerances. For example, tempered steel will lose hardness above 500° to 600° C., stainless steel will sensitize above 550° C. and nickel based super alloys average above 600° C.

It has been found that low deposition temperatures below the temper temperatures of such metals can be used to deposit metal compound coatings of the type discussed above by utilizing sub-halide compounds of the metal in question in the deposition reaction. The phrase metal sub-halides refers to metal halides in which the metal exhibits a valency state (oxidation state) lower than the maximum valency state known for that metal. For example, the maximum valency for titanium is 4, i.e., $TiCl_4$. Therefore, the halide compounds of $TiCl_3$ and $TiCl_2$ where titanium exhibits a valency of 3 and 2, respectively, are titanium sub-halides and, in particular, titanium sub-chlorides. Similarly, where the maximum valency state of the metal is 5, any halide compound of that metal wherein the metal exhibits a valency state lower than 5, would be a sub-halide of that metal.

In Canadian Pat. No. 1,087,041, the deposition of hafnium carbide and hafnium nitride coatings by chemical vapor deposition is discussed. At that time, temperatures typically in the neighborhood of 1,300° C. were required to produce hafnium coatings by chemical vapor deposition. That patent discloses the use of the sub-halides of hafnium in the deposition process, and thereby achieve temperatures as low as 900° C. in the deposition reaction. However, as discussed above, 900° C. is still above the temper loss point for many alloys that it is desirable to coat.

SUMMARY OF THE INVENTION

It has been found that good coatings with very favorable adhesion, structure and purity characteristics at good deposition rates using deposition temperatures less than 900° C., for example, 890° C., can be accomplished using metal sub-halides and properly controlling the flow rates and partial pressures of the reactants so as to promote favorable kinetic and thermodynamic conditions to promote acceptable reaction rates at the desired lower temperatures.

The metal coating of the present invention has shown good adhesion to a substrate and high cohesive strength. Without being limited to any particular theory for this discovery, these properties may result from using low temperatures in my coating process which permits avoiding changes in a substrate material, that adversely will effect properties and performance of the coating, including avoiding formation of a weak interlayer between the coating and the substrate and avoiding decarborization of the substrate.

In a preferred embodiment, titanium nitride coatings have been produced on a substrate by passing a controlled flow at about 400 volumes of hydrogen and about 10 volumes of hydrogen chloride over a bed of titanium metal particles heated to about 500° C., mixing 100 volumes of hydrogen and 150 volumes of nitrogen with the resulting hydrogen and titanium chloride and passing the gaseous mixture over a substrate heated to about 600° C.

Further improvements and modifications in the process include mixing the nitrogen with the hydrogen before passing the mixture over the titanium metal particles and ammonia gas with the hydrogen and nitrogen mixture prior to introducing it to the substrate but continuing the addition of ammonia gas for a limited period of time. Further improvement and modification are obtained by varying the pressure of the gaseous mixture passed over the substrate and maintaining the pressure of the mixed gas around the substrate at a pressure not more than about 4 millimeters of mercury. The selection of pressure is such as to produce Knudsen flow of the gas.

A thermodynamic analysis indicates that the lower halides (or sub-halides) of titanium, and in particular, titanium bichloride (TiCl$_2$), and titanium trichloride (TiCl$_3$) (subchlorides of titanium) facilitate a larger reaction negative-free energy value and accordingly a greater potential for reaction involving the deposition of TiN by CVD at low temperatures. Indeed, the potential of titanium bichloride and titanium trichloride to react with nitrogen and hydrogen in a gaseous environment to deposit titanium nitride continues to increase right down to 0° K. Nonetheless, reaction kinetics can inhibit the deposition of titanium nitride at low temperatures. However, it has been found that the potential for the reaction of TiCl$_2$ and TiCl$_3$ to form titanium nitride can be tapped in a vapor environment containing nitrogen and hydrogen using reaction temperatures in the range of 250° C. to 850° C. Although even lower coating temperatures are possible depending on deposition conditions used to overcome unfavorable kinetics, the temperatures used are intended to take full advantage of the favorable coating rates at a temperature which does not result in loss of temper or hardness in the tool substrates or item being coated, that is, a temperature which avoids changes in properties or characteristics, either physical or chemical, of the substrate being coated. Thus, the substrate retains its precoated, that is, original temper or hardness properties. It is essential to keep the free energy of the reaction at or about a predetermined negative value in order that the temperature at which the reaction and the deposition of titanium nitride, in the case of titanium, takes place will be maintained in this temperature range.

In particular, the higher the equilibrium constant ($K_p$) of the reaction, the lower the reaction-free energy value will be, and accordingly, the partial pressure of the reactants and their flow rates are maintained at carefully controlled levels to permit the reaction to be carried out in the desired temperature range. In addition, the use of ammonia in the chemical vapor deposition stage assists in maintaining a higher equilibrium constant value and in enhancing the coating rates and quality.

Accordingly, titanium nitride is deposited by chemical vapor deposition by reacting titanium bichloride and/or titanium trichloride with hydrogen and nitrogen, and optionally some ammonia, at a suitable temperature that will not detrimentally affect substrate properties and using flow rates which maintain partial pressures of the reactants, TiCl$_2$ and TiCl$_3$, at relatively high levels. The favorable thermodynamics and kinetic factors are thereby utilized for the deposition of titanium nitride at the desirable temperature.

Titanium bichloride and titanium trichloride, because of their thermodynamic characteristics in reaction, are important ingredients in the reaction for the deposition of titanium nitride. Titanium bichloride and titanium trichloride can be produced by the reduction of titanium tetrachloride, but such reduction yields quantities of both that are smaller than are required to conduct the deposition of TiN at suitably high rates.

Titanium bichloride and titanium trichloride can, of course, be obtained from other sources and simply be fed to a chemical vapor deposition chamber for the production of titanium nitride. Alternatively, a second embodiment of the invention involves a preliminary in situ step for the production of titanium sub-chlorides by passing hydrogen chloride over titanium metal. Such reaction will produce titanium bichloride, titanium trichloride, and titanium tetrachloride and their relative proportions in the gas reaction mixture can be varied by manipulating the titanium metal chlorination conditions such as temperature or the partial pressures of hydrogen and the chlorinating agents such as hydrogen chloride.

To increase the concentration of TiCl$_2$ and TiCl$_3$, which are less volatile than TiCl$_4$, in the gas reaction mixture, the in situ chlorination of titanium metal and the deposition of TiN in the two stage process can also be conducted at low pressures. Reduction of pressure in the chlorination process facilitates vaporization of the sub-chlorides which have a higher vaporization temperature than TiCl$_4$. This, in turn, permits chlorination to be performed at a lower temperature which, in turn, promotes production of the sub-chlorides. The use of low pressures in the vicinity of 4 millimeters of mercury pressure in the second stage of the process, that is the deposition of titanium nitride, also enhance the operation by improving the kinetic factors which favor deposition of titanium nitride on the substrate.

BRIEF DESCRIPTION OF THE DRAWINGS

The invention will be better understood with reference to examples which follow and with reference to the following figures, in which.

DESCRIPTION OF THE INVENTION

Figure 1:
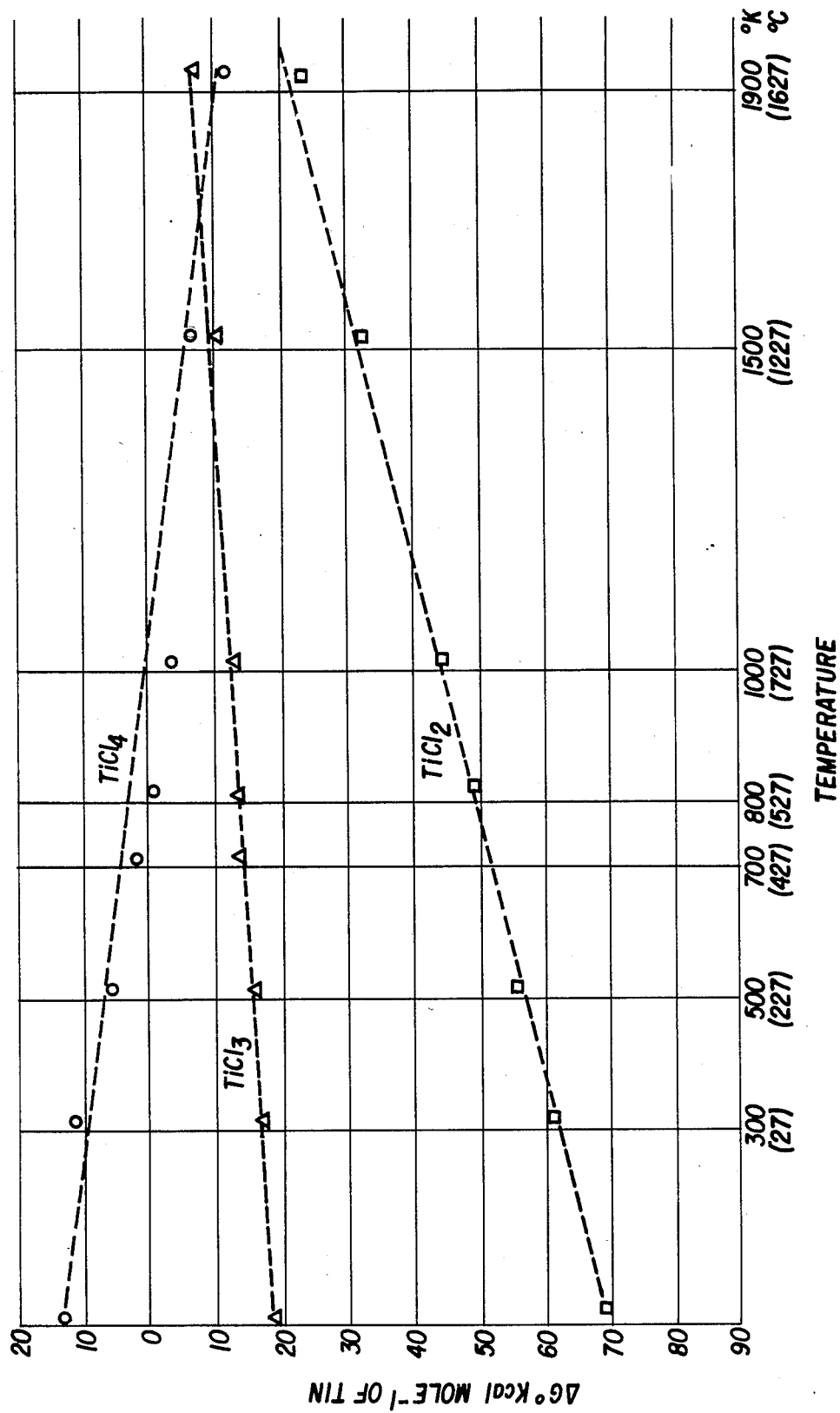
FIG. 1 shows the standard free energy versus temperature plots for the reactions of titanium tetrachloride, TiCl$_4$, titanium trichloride, TiCl$_3$, and titanium bichloride, TiCl$_2$, with nitrogen and hydrogen to deposit titanium nitride.

FIG. 1 includes a thermodynamic evaluation of the potential reactions available in a CVD coating process using titanium chlorides and indicates what reactant is preferable for reaction in any desired temperature range. In particular, FIG. 1 shows the standard free energy versus temperature plots for reactions 1, 2 and 3 below:

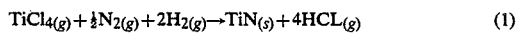

$$TiCl_{4(g)} + \tfrac{1}{2}N_{2(g)} + 2H_{2(g)} \rightarrow TiN_{(s)} + 4HCL_{(g)} \qquad (1)$$

$$TiCl_{3(g)} + \tfrac{1}{2}N_{2(g)} + 3/2H_{2(g)} \rightarrow TiN_{(s)} + 3HCl_{(g)} \qquad (2)$$

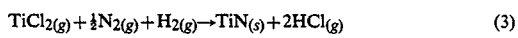

$$TiCl_{2(g)} + \tfrac{1}{2}N_{2(g)} + H_{2(g)} \rightarrow TiN_{(s)} + 2HCl_{(g)} \qquad (3)$$

FIG. 1 indicates the standard free energy values ($\Delta G°$) for these reactions at reaction temperatures ranging from $-273°$ C. (0° K.) to 1627° C. (1900° K.) As indicated, the lower the free energy value the greater is the potential for reaction, although there is a point beyond which it is difficult to tap this potential due to unfavorable kinetics.

The plots in FIG. 1 disclose that whereas TiCl$_4$ can be effective in depositing TiN at temperatures of 727° C. (1000° K.) and greater, TiCl$_3$ and TiCl$_2$ have potential for participating in the above reactions and depositing TiN at reaction temperatures down to $-273°$ C. (0° K.). The potential for reaction of the latter compounds is due to the large negative free energy change accompanying reactions (2) and (3). The formation of TiN from TiCl$_2$ or TiCl$_3$ becomes more favorable as the temperature is decreased. Nonetheless, at $-273°$ C. (absolute 0° K.) any reaction would be very limited because of unfavorable kinetics. In addition, to trigger the reaction at any temperature requires manipulation of the physical process variables (i.e., kinetic variables), such as pressures and flow rates, and the thermodynamic values, such as the equilibrium constants (Kp), a key constituent in the free energy value of the reaction. Varying kinetic factors and thermodynamic values will result in the reaction occurring at different temperatures. This will be better understood in part by reference to the factors which control the free energy value and in particular the relation between the free energy value and in the equilibrium value (Kp). Table I lists the equilibrium constants (Kp) for the reactions (1), (2) and (3) at temperatures in the range of 27° C. to 1627° C.

TABLE I

| Temperature °K.(°C.) | Reaction (1) Kp | Reaction (2) Kp | Reaction (3) Kp |
| --- | --- | --- | --- |
| 300 (27) | $1.1 \times 10^{-8}$ | $1.7 \times 10^{12}$ | $1.4 \times 10^{44}$ |
| 500 (227) | $3.0 \times 10^{-3}$ | $7.3 \times 10^{6}$ | $1.2 \times 10^{24}$ |
| 700 (427) | $2.6 \times 10^{-1}$ | $3.9 \times 10^{4}$ | $8.2 \times 10^{15}$ |
| 800 (527) | 2.1 | $7.6 \times 10^{3}$ | $1.9 \times 10^{13}$ |
| 1,000 (727) | 1.57 | $6.7 \times 10^{2}$ | $4.0 \times 10^{9}$ |
| 1,500 (1227) | 10. | $3.3 \times 10$ | $5.1 \times 10^{4}$ |
| 1,900 (1627) | 24.8 | 8.8 | $5.0 \times 10^{2}$ |

$K_p$ and $G°_T$ relates as follows—(using reaction 3 for illustration purposes):

$$(K_p)_T = \frac{(P-HCl)^2 \times (P-TiN)}{P-TiCl_2 \times (P-N_2)^{\frac{1}{2}} \times P-H_2} \quad (4)$$

wherein P-HCl denotes the partial pressure of HCl at the reaction temperature T.

$$\Delta G°_T = -RT\ln (K_p)_T \quad (5)$$

where R is the universal gas constant, T is the reaction temperature ln $(K_p)_T$ is the log to the base e of $(Kp)_T$.

As can be seen from equation (5) the free energy change ($\Delta G°_T$) is proportional to the negative of the equilibrium constant. Accordingly, the larger the equilibrium constant, the greater the negative value of free energy change and the greater the potential for reaction.

Therefore, from FIG. 1, using TiCl₃, it will be seen that for TiCl₃ to participate in reaction (2) at a temperature of about 500° C., the free energy value needs to be in the range of −14 Kcal/per mole of TiN. With these free energy and temperature values, equation (5) then determines a fixed value for $K_p$ at that temperature and from this series of partial pressure combinations for the reactants of the reaction are available. In addition, as discussed further below, it has been found beneficial to introduce ammonia into the reaction of TiCl₂ and TiCl₃ in reactions (2) and (3) to enhance the rate of deposition of TiN.

Process apparatus for carrying out TiN deposition will now be described and will be followed by examples of deposition of TiN coatings on substrates at the desired reaction temperatures by varying and manipulating the process variables.

Figure 2:
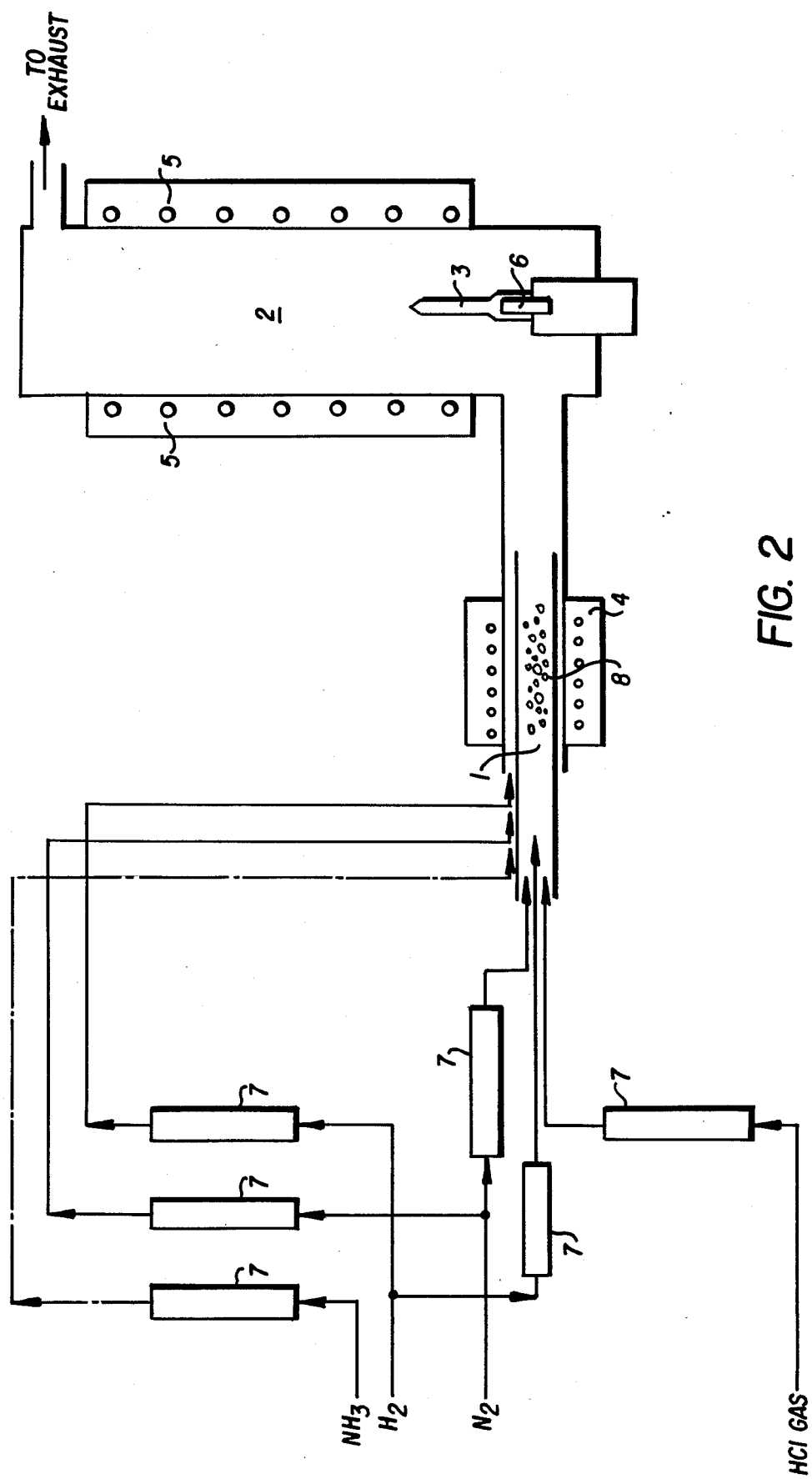
FIG. 2 shows schematically the two-stage process to carry out the chemical vapor deposition of titanium nitride at low temperatures utilizing the sub-chlorides of titanium metal such as TiCl$_2$ and TiCl$_3$.

FIG. 2 shows a process apparatus which comprises two basic reaction chambers, a first chlorination chamber 1 upstream of and connected integrally with a coating chamber 2. The chlorination chamber is heated by a conventional resistively heated furnace 4. The tool substrate 3 is mounted within the coating chamber 2 and the chamber 2 is heated using conventional resistive heating means 5. In addition and alternatively, the substrate 3 is independently heated in the coating chamber utilizing a conventional resistively heated cartridge heater 6.

In chamber 1, the resistance heated furnace 4 heats titanium Ti metal chips from 150° C. to 1100° C. and HCl and H₂ are fed through flow meters 7, passed over the heated titanium 8 to produce TiCl₂ and TiCl₃ and hydrogen in accordance with the following resultant reactions:

$$X \; HCl_{(g)} + Ti_{(s)} \rightarrow TiCl_{(x)} + \frac{X}{2} H_2 \; (X = 2 \text{ or } 3) \quad (6)$$

This reaction may also produce quantities of TiCl₄. However, the parameters of this reaction are controlled by using suitable combinations of reaction temperatures, and relative flow rates of H₂ and HCl to provide lower partial pressures of HCl, to steer the reaction towards predominant production of TiCl₃ and TiCl₂.

The TiCl₂ and TiCl₃ gases are carried by a carrier gas such as hydrogen or helium from chlorination chamber 1 to coating chamber 2 to which hydrogen and nitrogen are fed through flowmeters to foster reactions (2) and (3). Before reaching chamber 2, the hydrogen and nitrogen are preheated by passing through the furnace 4 in an annular chamber about reaction chamber 1. As discussed above, for the desired reactions (2) and (3) at a temperature in the range of 250° C. to 850° C. the value of Kp is fixed thermodynamically by formula (5) and a range of flow rates and partial pressure values can be determined. As will be appreciated, the flow rates chosen will affect the kinetics of the reaction. All the following examples are carried out on equipment of the type generally illustrated in FIG. 2 and produced TiN coatings, and except where indicated otherwise the equipment is operated at 1 atm. pressure.

TABLE II

| | COATING CONDITIONS | | |
| --- | --- | --- | --- |
| | Coating Temperature (°C.) | Flow rates (ml/min.) | |
| No. | Chamber 2 | H₂ | N₂ |
| 1 | 500 | 50 | 40 |
| 2 | 500 | 100 | 100 |
| 3 | 500 | 50 | 100 |
| 4 | 700 | 100 | 50 |
| 5 | 640 | 100 | 100 |
| 6 | 600 | 100 | 100 |
| 7 | 575 | 30 | 50 |
| 8 | 575 | 50 | 50 |
| 9 | 522 | 30 | 50 |
| 10 | 380 | 30 | 50 |
| 11 | 510 | 30 | 50 |
| 12* | 600 | 150 | 100 |
| 13 | 600 | 100 | 230 |
| 14 | 600 | 100 | 430 |
| 15 | 600 | 100 | 330 |
| 16 | 600 | 100 | 230 |
| 17 | 600 | 100 | 350 |
| 18 | 600 | 100 | 350 |
| 19 | 600 | 100 | 350 |
| 20 | 600 | 100 | 350 |
| 21 | 800 | 100 | 350 |

*Deposition conducted at a total pressure of 4.1 mm.

TABLE III

| | CHLORINATION CONDITIONS | | |
| --- | --- | --- | --- |
| | Reaction | Flow Rates (ml/min.) | |
| No. | Temperature (°C.) | H₂ | HCl |
| 1 | 500 | 150 | 5 |
| 2 | 500 | 200 | 8.5 |
| 3 | 750 | 300 | 10 |
| 4 | 800 | 50 | 10 |

TABLE III-continued

| | CHLORINATION CONDITIONS | | |
|---|---|---|---|
| | Reaction | Flow Rates (ml/min.) | |
| No. | Temperature (°C.) | H₂ | HCl |
| 5 | 800 | 300 | 15 |
| 6 | 850 | 300 | 15 |
| 7 | 800 | 200 | 10 |
| 8 | 800 | 200 | 10 |
| 9 | 800 | 200 | 10 |
| 10 | 800 | 200 | 10 |
| 11 | 800 | 200 | 10 |
| 12* | 600 | 150 | 5 |
| 13 | 600 | 600 | 12 |
| 14 | 600 | 1200 | 12 |
| 15 | 600 | 900 | 12 |
| 16 | 600 | 800 | 8 |
| 17 | 600 | 800 | 8 |
| 18 | 600 | 600 | 8 |
| 19 | 600 | 1200 | 8 |
| 20 | 600 | 400 | 8 |
| 21 | 650 | 800 | 8 |

*Chlorination conducted at a total pressure of 4.1 mm.

It has been further found that the quality of the deposit and the rate of deposition of TiN in the above CVD reactions can be improved by the addition of ammonia to the gas reaction mixture. In the examples which follow, substrate materials such as copper, stainless steel and nickel based super alloy are independently heated in the coating chamber by mounting them on a cartridge heater. The temperature of the cartridge heater was controlled using a temperature controller. Temperatures of the copper, stainless steel and nickel based super alloy substrate materials are monitored using a separate thermocouple attached to their surfaces. The walls of the coating chamber are maintained at a constant temperature using the resistively heated furnace arrangement, as in the previous examples in Tables II and III. It is, of course, always important to have the coating chamber and its walls at a temperature high enough to keep the metal sub-halides in the gas phase and avoid any condensing-out at the walls.

A coating period of one hour and an operating pressure of 1 atm. is used for all the coating runs summarized in Table IV. In all of the examples given in Table IV the same chlorination step in chamber 1 is conducted at 500° C. and at flow rates of 10 ml/min. of HCl and 400 ml/min. of H₂. Details of the deposition conditions used are given in Table IV.

From the previous examples relating to the use of ammonia, it can be seen from the results given in Table IV that ammonia is not only effective in enhancing the deposition of TiN thermodynamically as a comparison of the examples 1 with 4 shows; but also improves the kinetics of the deposition of TiN, as a comparison of the examples 3 with 1, 2, and 4 illustrates.

The examples shown in Table V illustrate the advantages of pressure reduction in the chamber where a coating is occurring and in the chlorination process. It will be seen in Table V, with a pressure in the coating chamber of 2 millimeters of mercury and flow rates as shown and the addition of ammonia, good coatings are obtained. Table V also illustrates, in the third example, the effect of introducing the nitrogen in the first stage of the process during chlorination. Unexpectedly, the nitrogen does not result in nitrides being retained in the first reaction but permits a better control. In the third example with a flow rate of 20 milliliters of hydrogen and 6 milliliters of HCl and 20 milliliters of N₂ with the chamber pressure of 1.5 millimeters of mercury a suitable coating could be obtained.

While Table V illustrates examples of operation at reduced pressure, it has been found that introduction of nitrogen in the first stage is also practical at atmospheric pressures.

A detailed description of the procedure used in coating with particular reference to the first example of Table V follows.

The apparatus is partially evacuated through the exhaust with all inlet gas flows shut off. The whole apparatus is flushed with a gas such as hydrogen or helium which is not reactive with other materials. Flushing is continued to rid the apparatus of water vapor and oxygen.

The temperature of the titanium is raised to 500° C. by furnace 4 and the temperature of substrate 3 is raised to 600° C. by heating means 5. These temperatures are measured by suitably located thermocouples.

The pressure within the apparatus is reduced. Hydrogen and hydrogen chloride at volume ratio of 40/12 is now permitted to flow over the titanium and hydrogen, nitrogen and ammonia in the volume ratio of 20/10/3 are mixed with the resulting gases from the first stage.

The mixed gas flow into chamber 2 and a total pressure of about 2 mm.Hg. is maintained. The temperatures, gas flows and pressures are maintained for a suitable period of time, one hour for example.

At the end of the cycle the apparatus is permitted to cool down, the gas flow reverted to inert gas and the workpiece removed. Preferably the stage 1 portion of the apparatus is at least partially sealed off before the chamber 2 is opened to atmosphere thus simplifying the flushing process in the next cycle.

It will be understood that the above disclosure has dealt with TiN coatings only by way of example. The low temperature deposition principles disclosed above apply equally to the deposit of zirconium nitride, hafnium nitride, carbides and carbonitrides of titanium, zirconium and hafnium nitrides and carbides and carbonitrides of vanadium, niobium and tantalum (the vanadium sub-group of metals) and of chromium, molybdenum and tungsten (the chromium sub-group of metals). In fact, the invention applies to those metals of Group IVB, Group VB and Group VIB and to combinations of those metals because the metals have a variable valency and it is possible to use those valencies which have the lower free energy of formation when forming metallic halides. In the case of carbide coatings the reactant gases in the deposition reaction are a hydrocarbon such as CH₄, H₂ and the metal sub-halide. In the case of carbonitride coatings the reactant gases in the deposition reaction are hydrocarbon such as CH₄, H₂ and N₂ and/or NH₃ and the metal sub-halide. The substrates mentioned in this disclosure are exemplary, not exclusive. Other known substrates can be coated using the method and apparatus of this invention. Refractory materials, like glass and ceramics, are set forth in 20 Kirk-Othmer Encyclopedia of Chemical Technology (3rd ed. 1982). Other known inert gas can be used.

TABLE IV

| | COATING CONDITIONS | | | | | |
|---|---|---|---|---|---|---|
| | TEMPERATURE (°C.) | | FLOW RATES (ml/min) | | | QUALITY OF TiN |
| NO. | Coating Chamber Walls | Substrate | $H_2$ | $N_2$ | $NH_3$ | COATINGS |
| 1 | 400 | 600 ± 10 | 100 | 150 | — | A thin TiN coating was deposited |
| 2 | 400 | 600 ± 10 | 200 | 50 | 50 | Good, about ½ to 1 μm thick |
| 3 | 400 | 600 ± 10 | 200 | 50 | 50* | Excellent, about ½ to 1 μm thick. |
| 4 | 425 | 600 ± 10 | 200 | 50 | 5 | Good, about ½ to 1 μm thick |

*In No. 3, ammonia was allowed to flow only for the first five minutes of the total one hour duration of the coating run, after which it was turned off.

TABLE V

| | Chlorination Conditions (Stage 1) | | | | | Coating Conditions (Stage 2) | | | | |
|---|---|---|---|---|---|---|---|---|---|---|
| Example No. | Temperature °C. | $H_2$ ml/min. | HCl ml/min. | $N_2$ ml/min. | Pressure mm.Hg. | Temperature °C. | $H_2$ ml/min. | $N_2$ ml/min. | $NH_3$ ml/min. | Comments |
| 1 | 500 | 40 | 12 | — | 2 | 600 | 20 | 10 | 3 | Good adherent coating of TiN, gold color, about .5 microns thick. No detectable chlorine. |
| 2 | 500 | 25 | 6 | — | 1 | 600 | 20 | 10 | — | Similar to above. |
| 3 | 500 | 20 | 6 | 20 | 1.5 | 600 | 20 | — | — | Similar to above but thinner. Coating rate slightly reduced. |

While I have shown and described one embodiment in accordance with the present invention, it is understood that the same is not limited thereto but is susceptible of numerous changes and modifications as known to those skilled in the art, and I, therefore, do not wish to be limited to the details shown and described herein, but intend to cover all such changes and modifications as are encompassed by the scope of the appended claims.

I claim:

1. A method of producing metal compound coatings of one of the group of metals including titanium, zirconium, hafnium, vanadium, niobium, tantalum, chromium, molybdenum and tungsten on a substrate comprising:
   (a) reacting in a reaction chamber in the presence of a substrate a gaseous mixture of the metal subchlorides with one member of the groups of gaseous mixtures comprising hydrogen and nitrogen; hydrogen, nitrogen and ammonia; hydrogen and a hydrocarbon; hydrogen, nitrogen and a hydrocarbon; and hydrogen, nitrogen, ammonia and a hydrocarbon;
   (b) manipulating the free energy value for the reaction and the kinetic parameters of the reaction to facilitate a reaction temperature in the range of 250° to 850° C.;
   (c) maintaining the reaction temperature of the substrate and the reaction chamber in the said reaction temperature range;
   whereby the coating being one of the group of a metal nitride, and a metal carbide and a metal carbonitride is deposited on the substrate.

2. A method of producing metal compound coatings of one of the group of the metals including titanium, zirconium and hafnium on a substrate comprising:
   (a) reacting in a reaction chamber in the presence of a substrate of gaseous mixture of the metal subchlorides with one member of the groups of gaseous mixtures comprising hydrogen and nitrogen; hydrogen, nitrogen and ammonia; hydrogen and a hydrocarbon; hydrogen, nitrogen, and a hydrocarbon; and hydrogen, nitrogen, ammonia and a hydrocarbon;
   (b) manipulating the free energy value for the reaction and the kinetic parameters of the reaction to facilitate a reaction temperature in the range of 250° to 850° C.;
   (c) maintaining the reaction temperature of the substrate and the reaction chamber in the said reaction temperature range;
   whereby the coating being one of the group of a metal nitride, and a metal carbide and a metal carbonitride is deposited on the substrate.

3. A method of producing coatings of nitrides of one of the group of the metals including titanium, zirconium and hafnium on substrates comprising:
   (a) reacting a reaction chamber in the presence of a substrate a gaseous mixture of the metal subchlorides with one member of the groups of gaseous mixtures comprising hydrogen and nitrogen; and hydrogen, nitrogen and ammonia;
   (b) manipulating the free energy value for the reaction and the kinetic parameters of the reaction to facilitate a reaction temperature in the range of 250° to 850° C.;
   (c) maintaining the reaction temperature of the substrate and the reaction chamber in the said reaction temperature range;
   whereby the metal nitride is deposited on the substrate.

4. A method of producing coatings of titanium nitride on a substrate, comprising:
   (a) reacting in a reaction chamber in the presence of a substrate a gaseous mixture of titanium subchlorides with a gaseous mixture of hydrogen and nitrogen;
   (b) manipulating the free energy value for the reaction and the kinetic parameters of the reaction to facilitate a reaction temperature in the range of 250° to 850° C.;

(c) maintaining the reaction temperature of the substrate and the reaction chamber in the said reaction temperature range;

whereby the titanium nitride is deposited on the substrate.

5. A method of producing coatings of titanium nitride on a substrate comprising:
   (a) reacting in a reaction chamber in the presence of a substrate a gaseous mixture of titanium subchlorides with a gaseous mixture of hydrogen, nitrogen and ammonia;
   (b) manipulating the free energy value for the reaction and the kinetic parameters of the reaction to facilitate a reaction temperature in the range of 250° to 850° C.,
   (c) maintaining the reaction temperature of the substrate and the reaction chamber in the said reaction temperature range;

whereby the titanium nitride is deposited on the substrate.

6. A method of producing coatings of titanium nitride on a substrate as claimed in claim 4 wherein the manipulated reaction temperature is in the range of 380° to 800° C.

7. A method of producing coatings of titanium nitride on a substrate as claimed in claims 4 or 5 wherein the manipulated reaction temperature is in the range of 400° to 610° C.

8. A method as claimed in claim 3 whereby the flow rates and partial pressures of the reactant gases are regulated to produce a reaction free energy value and reaction kinetics that facilitate said reaction temperature.

9. A method as claimed in claim 3 comprising the additional prior step of producing the metal sub-chlorides in a reaction area upstream of said deposit reaction in said reaction chamber, said prior step comprising:
   (a) passing gaseous hydrogen chloride and hydrogen over the metal in said reaction area;
   (b) maintaining said reaction area in the temperature range of 150° to 1100° C.;
   (c) maintaining the flow rates and partial pressures of hydrogen and hydrogen chloride to provide low partial pressures of hydrogen chloride and promote the production of the metal sub-chlorides.

10. A method as claimed in claim 4 comprising the additional prior step of producing titanium sub-chlorides in a reaction area upstream of said deposit reaction in said reaction chamber, said prior step comprising:
    (a) passing gaseous hydrogen chloride and hydrogen over titanium metal in said reaction area;
    (b) maintaining said reaction area in the temperature range of 150° to 1100° C.;
    (c) maintaining the flow rates and partial pressures of hydrogen and hydrogen chloride to provide low partial pressures of hydrogen chloride and promote the production of the titanium sub-chlorides.

11. A method as claimed in claim 9 in which said reaction area is maintained in the temperature range of 500° to 850° C.

12. A method as claimed in claim 4 comprising the additional prior step of producing titanium sub-chlorides in a reaction area upstream of said deposit reaction in said reaction chamber, said prior step comprising:
    (a) passing gaseous hydrogen chloride and hydrogen over titanium metal in said reaction area;
    (b) maintaining said reaction area in the temperature range of 500° to 850° C.;
    (c) maintaining the flow rates and partial pressures of hydrogen and hydrogen chloride to provide low partial pressures of hydrogen chloride and promote the production of the titanium sub-chlorides.

13. A method as claimed in claim 4 wherein the gas reactants flow into said reaction chamber continuously, the method comprising the additional step of including ammonia gas in the initial flow of gas reactants and terminating all flow of ammonia gas once said deposition has commenced.

14. A method of producing metal compound coatings of at least one of the metals from groups IVB, VB and VIB on a substrate comprising:
    (a) reacting in a coating chamber in the presence of a substrate of gaseous mixture of metal subhalides with a gaseous mixture comprising hydrogen and nitrogen; hydrogen, nitrogen and ammonia; hydrogen and hydrocarbon; hydrogen, nitrogen, and a hydrocarbon; and hydrogen, nitrogen, ammonia or a hydrocarbon;
    (b) manipulating a free energy value for the reaction and kinetic parameters of the reaction to facilitate a reaction temperature in the range of about 250° to less than 900° C.;
    (c) maintaining the reaction temperature of the substrate and the reaction chamber in said reaction temperature range;

whereby a coating of metal nitride, a metal carbide or a metal carbonitride is deposited on the substrate.

15. The method according to claim 14 wherein the metal of the metal compound is titanium, zirconium or hafnium.

16. The method according to claim 15 wherein the gaseous mixture in the coating chamber is a mixture comprising hydrogen and nitrogen; or hydrogen, nitrogen and ammonia; whereby metal nitride is deposited on the substrate.

17. The method according to claim 14 wherein the metal is titanium and the gaseous mixture in the chamber is hydrogen and nitrogen; whereby titanium nitride is deposited on the substrate.

18. The method according to claim 14 wherein the temperature range is 380° to 800° C.

19. The method according to claim 14 wherein the temperature range is 400° to 610° C.

20. The method according to claim 14 further comprising producing the metal sub-halide by passing at least hydrogen halide over the metal in a reaction area, maintaining the reaction area in the temperature range of 150° to 1100° C. and controlling the flow of hydrogen halide over the metal to promote the production of metal sub-halide.

21. The method according to claim 20 further comprising introducing nitrogen gas into the process in the reaction area of where the metal sub-halide is being produced.

22. The method according to claim 14 wherein the substrate includes copper, stainless steel or nickel based super alloy.

23. A method of producing titanium nitride coatings on a substrate comprising:
    passing a controlled flow of about 40 volumes of hydrogen and about 12 volumes of hydrogen chloride over a bed of titanium metal particles heated to about 500° C. forming subhalides;
    mixing 20 volumes of hydrogen and 10 volumes of nitrogen with the resulting hydrogen and titanium chloride gases; and passing the gaseous mixture over a substrate heated to about 600° C. to obtain a titanium nitride coated substrate.

24. The method according to claim 23 further comprising maintaining the gaseous mixture surrounding the substrate at a pressure of not more than about 4 millimeters of mercury.

25. The method according to claim 20 further comprising introducing ammonia into the coating chamber and into the gaseous mixture for a limited period of time during the initial coating process.

26. The method according to claim 23 further comprising maintaining the gaseous mixture at a pressure such that Knudsen flow predominates.

27. The method according to claim 23 further comprising introducing ammonia into the coating chamber and into the gaseous mixture for a limited period of time during the initial coating process.

28. A method of producing metal compound coatings of at least one of the metals from groups IVB, VB and VIB on a substrate comprising:
(a) reacting in a coating chamber in the presence of a substrate of gaseous mixture of metal subhalides with a gaseous mixture comprising hydrogen and nitrogen; hydrogen, nitrogen and ammonia; hydrogen and hydrocarbon; hydrogen, nitrogen, and hydrocarbon; and hydrogen, nitrogen, ammonia or hydrocarbon;
(b) manipulating a free energy value for the reaction and kinetic parameters of the reaction to facilitate a reaction temperature avoiding a change in properties of the substrate being coated;
(c) maintaining the reaction temperature of the substrate and the reaction chamber at said reaction temperature;
whereby a coating of metal nitride, a metal carbide or a metal carbonitride is deposited on the substrate.

29. A coated article consisting essentially of:
(a) a metal compound coating of metal nitride, metal carbide or metal carbonitride; the metal being at least one of the metals from Group IVB, VB and VIB of the Periodic Table of the Elements; and the metal compound coating being formed using a metal subhalide and using hydrogen and not least one of nitrogen, ammonia or methane; and
(b) the metal compound coating being deposited on and adhered to a metal substrate at a temperature below its softening point to avoid affecting its temper or hardness.

30. The article according to claim 29, wherein the substrate is a copper, stainless steel or nickel based super alloy.

31. The article according to claim 29, wherein the metal of the metal compound coating being titanium, zirconium, hafnium, vanadium, niobium, tantalum, chromium, molybdenum, tungsten or combinations thereof.

32. The article according to claim 29, wherein the metal nitride being titanium nitride.

33. The article according to claim 29, wherein the metal compound coating being zirconium nitride, hafnium nitride, carbides and carbonitrides of titanium, zirconium and hafnium nitrides, carbides and carbonitrides of vanadium, niobium and tantalum and of chromium, molybdenum and tungsten.

34. The coated article according to claim 29, further comprising manipulating a free energy value for the reaction and kinetic parameters of the reaction for forming the metal compound coating to facilitate a reaction temperature avoiding a change in properties of the substrate being coated.

35. The coated article according to claim 34, further comprising a reaction temperature in the range of about 250° to less than 900° C.

36. The coated article according to claim 29, wherein the substrate is a tool steel.

37. A coated article comprising:
(a) a metal compound coating of metal nitride; the metal being at least one of the metals from Group IVB, VB, and VIB of the Periodic Table of the Elements; and the metal compound coating being formed using a metal subhalide and using hydrogen and nitrogen or ammonia; and
(b) the metal compound coating being deposited on and adhered to a metal substrate at a temperature below its softening point to avoid affecting its temper or hardness.

* * * * *